US009224436B2

(12) United States Patent
Venkata et al.

(10) Patent No.: US 9,224,436 B2
(45) Date of Patent: Dec. 29, 2015

(54) APPARATUSES INCLUDING A MEMORY ARRAY WITH SEPARATE GLOBAL READ AND WRITE LINES AND/OR SENSE AMPLIFIER REGION COLUMN SELECT LINE AND RELATED METHODS

(71) Applicant: Micron Technology, Inc., Boise, ID (US)

(72) Inventors: Harish N. Venkata, Allen, TX (US);
John F. Schreck, Lucas, TX (US);
Mansour Fardad, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 13/902,591

(22) Filed: May 24, 2013

(65) Prior Publication Data
US 2014/0347945 A1 Nov. 27, 2014

(51) Int. Cl.
*G11C 7/18* (2006.01)
*G11C 7/12* (2006.01)
*G11C 7/06* (2006.01)

(52) U.S. Cl.
CPC *G11C 7/065* (2013.01); *G11C 7/18* (2013.01); *G11C 7/12* (2013.01)

(58) Field of Classification Search
CPC .. G11C 7/18; G11C 11/4091; G11C 11/4097; G11C 7/02
USPC .......................... 365/203, 205, 63, 51, 189.14
See application file for complete search history.

(56) References Cited

U.S. PATENT DOCUMENTS

| | | | |
|---|---|---|---|
| 6,310,815 B1 * | 10/2001 | Yamagata et al. | 365/230.03 |
| 6,400,597 B1 | 6/2002 | Nagaoka | |
| 6,480,407 B1 * | 11/2002 | Keeth | 365/51 |
| 7,616,512 B2 * | 11/2009 | Kim et al. | 365/205 |
| 7,983,109 B2 | 7/2011 | Hanzawa et al. | |
| 2005/0146957 A1 * | 7/2005 | Lee et al. | 365/203 |
| 2011/0044120 A1 * | 2/2011 | Nakagawa et al. | 365/203 |

OTHER PUBLICATIONS

Kalter, et al., "A 50-ns 16-Mb DRAM with a 10-ns Data Rate and On-Chip ECC", IEEE Journal of Solid-State Circuits, vol. 25, No. 5, Oct. 1990, 1118-1128.

* cited by examiner

*Primary Examiner* — Son Dinh
*Assistant Examiner* — Jerome Leboeuf
(74) *Attorney, Agent, or Firm* — Dorsey & Whitney LLP (57) ABSTRACT

Apparatuses and methods for memory arrays with separate global read and write lines and/or sense amplifier region column select lines are disclosed. An example apparatus includes first and second memory sections, and further includes a sense amplifier region. A memory section includes a word line extending in a first direction and a digit line extending in a second direction, and the sense amplifier region is disposed between the first and second memory sections. The sense amplifier region includes a sense amplifier coupled to the digit line, a local input/output (LIO) line, a column select circuit coupled to the sense amplifier, and a column select line. The column select line extends in the first direction and is configured to provide a column select signal to the column select circuit. Capacitance of a LIO line may be reduced by coupling fewer sense amplifiers of a group to the LIO line.

14 Claims, 7 Drawing Sheets

APPARATUSES INCLUDING A MEMORY ARRAY WITH SEPARATE GLOBAL READ AND WRITE LINES AND/OR SENSE AMPLIFIER REGION COLUMN SELECT LINE AND RELATED METHODS

BACKGROUND

As memory densities of semiconductor memory continue to increase, maintaining or decreasing memory access times and power consumption may be more challenging with conventional memory array architecture. Some physical dimensions of the memory circuitry may increase while other dimensions may be reduced in increasing memory density, in many instances resulting in challenges to fabrication and operation of the memory. For example, various signal lines, such as input/output lines, and control signal lines of a memory may need to extend over greater physical distances (e.g., longer signal lines) while having other physical dimensions reduced (e.g., width, spacing, pitch, etc.). The resulting signal lines have increased capacitance and are more difficult to drive to desired voltage levels. That is, it may require more time to drive the signal lines to the desired voltage levels.

Additional circuits or circuits having greater drivability have been included in memories to address increased signal line resistance and capacitance. However, including the additional circuits and circuits with increased drive require greater physical space on the memory, and may result in increased power consumption. Given that low power consumption, compactness, and relatively fast access times are desirable for current and future memories, conventional approaches to addressing shortcomings of known memory array architectures may be unacceptable.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
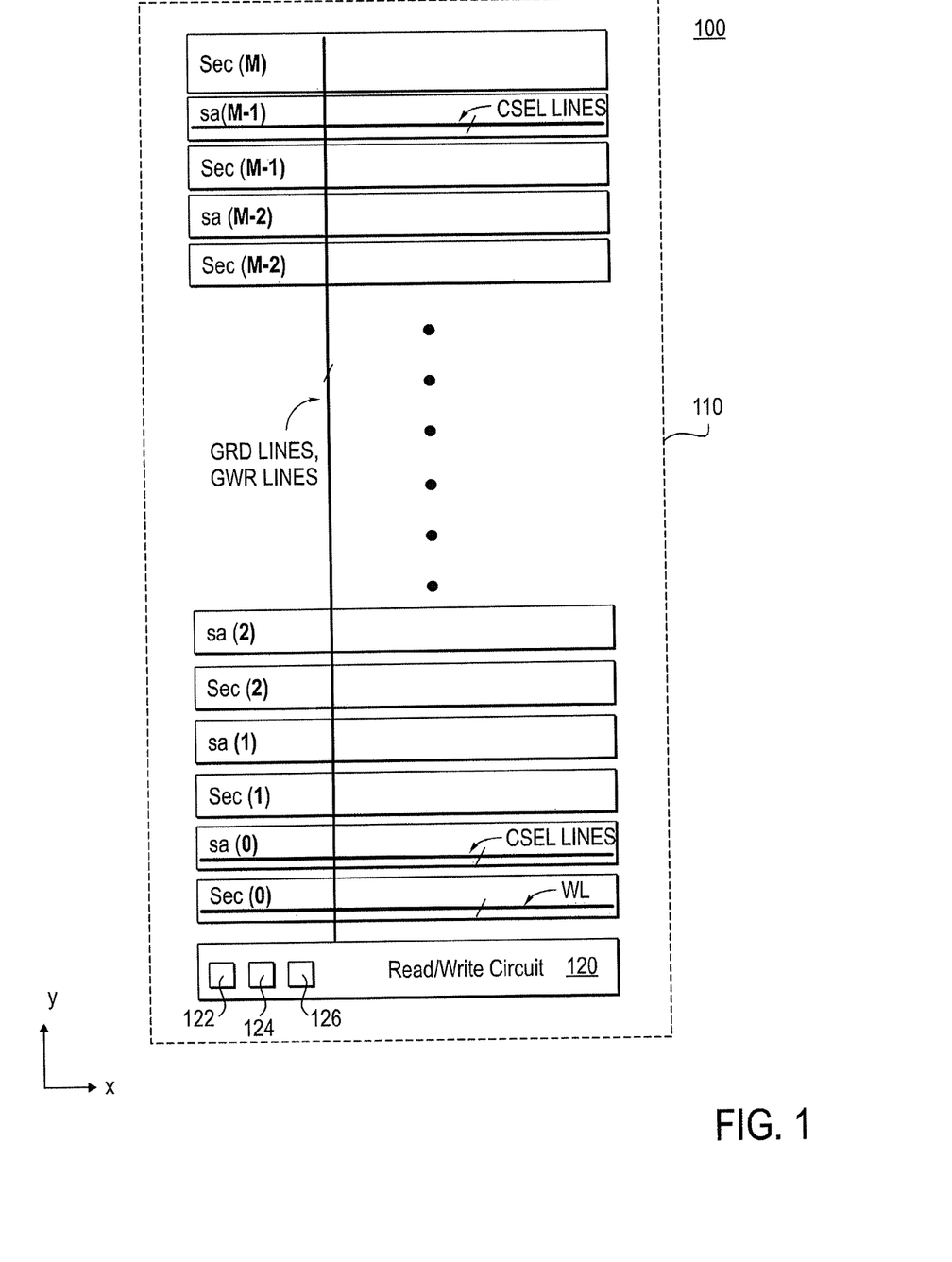
FIG. 1 is a block diagram of an apparatus including an array of memory cells according to an embodiment of the invention.

FIG. 1 illustrates an apparatus 100 that includes an array 110 of memory cells according to an embodiment of the invention. Examples of apparatuses may include an integrated circuit, a memory device, a memory system, an electronic device or system, a smart phone, a tablet, a computer, a server, etc. The array 110 is divided into memory sections Sec0-SecM. All or some of the array 110 may be logically divided into memory sections Sec0-SecM (e.g., by memory address), as well as or alternatively, physically divided into memory sections Sec0-SecM. Memory cells in a memory section are arranged in rows and columns, with a memory cell located at the intersection of a row and column which may be accessed by addressing the corresponding row and column. The rows represent wordlines and the columns represent digit lines that extend through a memory section. In the embodiment illustrated in FIG. 1, the wordlines extend along the x-direction (e.g., wordline WL), and the digit lines extend along the y-direction (not shown in FIG. 1). The digit lines may be differential pair of digit lines which include a pair of digit lines for each column of memory.

Sense amplifier regions sa0-sa(M−1) may be disposed between the memory sections Sec0-SecM. The sense amplifier regions sa0-sa(M−1) include sense amplifiers (not shown in FIG. 1) that are coupled to respective digit lines of adjacent memory sections. For example, the sense amplifier region sa0 includes sense amplifiers that are coupled to digit lines of memory sections Sec0 and Sec1. A sense amplifier is configured to sense a charge state of a memory cell coupled to the respective digit line and amplify a voltage according to the sensed charge state, where the charge state represents a data state stored by the memory cell. Local input/output (LIO) lines may be coupled to selective ones of the sense amplifiers, and global read (GRD) lines and global write (GWR) lines may be selectively coupled to the LIO lines to provide read data from the memory cells and write data to the memory cells. The LIO lines (not shown in FIG. 1) may be located in the sense amplifier regions sa0-sa(M−1), and the GRD and GWR lines may extend over the memory sections Sec0-SecM to a read/write circuit 120. The read/write circuit 120 may include data amplifiers 122 and write data drivers 124 that amplify read data and write data, respectively. As will be described in more detail below, the global lines include GRD lines that provide read data from the memory sections Sec0-SecM to be amplified by the data amplifiers 122, and the global lines further include GWR lines that provide write data amplified by write data drivers 124 to the memory sections Sec0-SecM. The read/write circuit 120 may further include precharge circuits 126 configured to precharge the GRD lines in anticipation for a memory access operation.

Data may be provided to and from the memory sections Sec0-SecM during a memory access operation (e.g., a read operation, a write operation). During a read operation of a memory cell, a wordline is activated and a row of memory cells are coupled to respective digit lines. The respective sense amplifiers sense the charge states of the memory cells and amplify the corresponding voltages. A sense amplifier is coupled to a LIO line, which is in turn coupled to a GRD line. A data amplifier of the read/write circuit 120 amplifies the voltage provided on the GRD line, which is representative of the read data. The read data is then output from the memory. During a write operation to a memory cell, a voltage representing the write data is amplified by a write data driver in the read/write circuit 120 that is coupled to a GWR line. The GWR line is coupled to an LIO line, which provides the amplified voltage through a sense amplifier coupled to the LIO line to be stored by a memory cell. In some embodiments, the LIO lines may be a differential pair of signal lines, that is, pairs of signal lines may be used to provide complementary voltages to and from the sense amplifiers. Likewise, the GRD and GWR lines may be differential pairs of signal lines in some embodiments as well.

As previously mentioned, a sense amplifier may be coupled to a LIO line during a memory access operation. A sense amplifier may be coupled to an LIO line through a respective column select switch that is activated by an active column select signal provided on a column select (CSEL) line. Column select signals for a group of column select switches may be provided by a column decoder coupled to respective CSEL lines. The CSEL lines in the embodiment of FIG. 1 are located in the sense amplifier regions sa0-sa(M−1) and may extend along the x-direction. The CSEL lines may extend along the same direction as the wordlines. The CSEL lines may be shorter in length compared to a memory architecture having the CSEL lines extending along the y-direction over several memory sections Sec0-SecM. The shorter CSEL lines in the sense amplifier region may have relatively less capacitive loading, which may result in faster memory access cycle times and/or lower power consumption compared to an architecture having longer CSEL lines.

It will be appreciated that one or more wordlines, digit lines, LIO lines, GRD lines, GWR lines and CSEL lines may be included in the array 110, and that the embodiment illustrated in FIG. 1 has been provided by way of example and is not intended to limit the scope of the invention to the particular embodiment.

Figure 2:
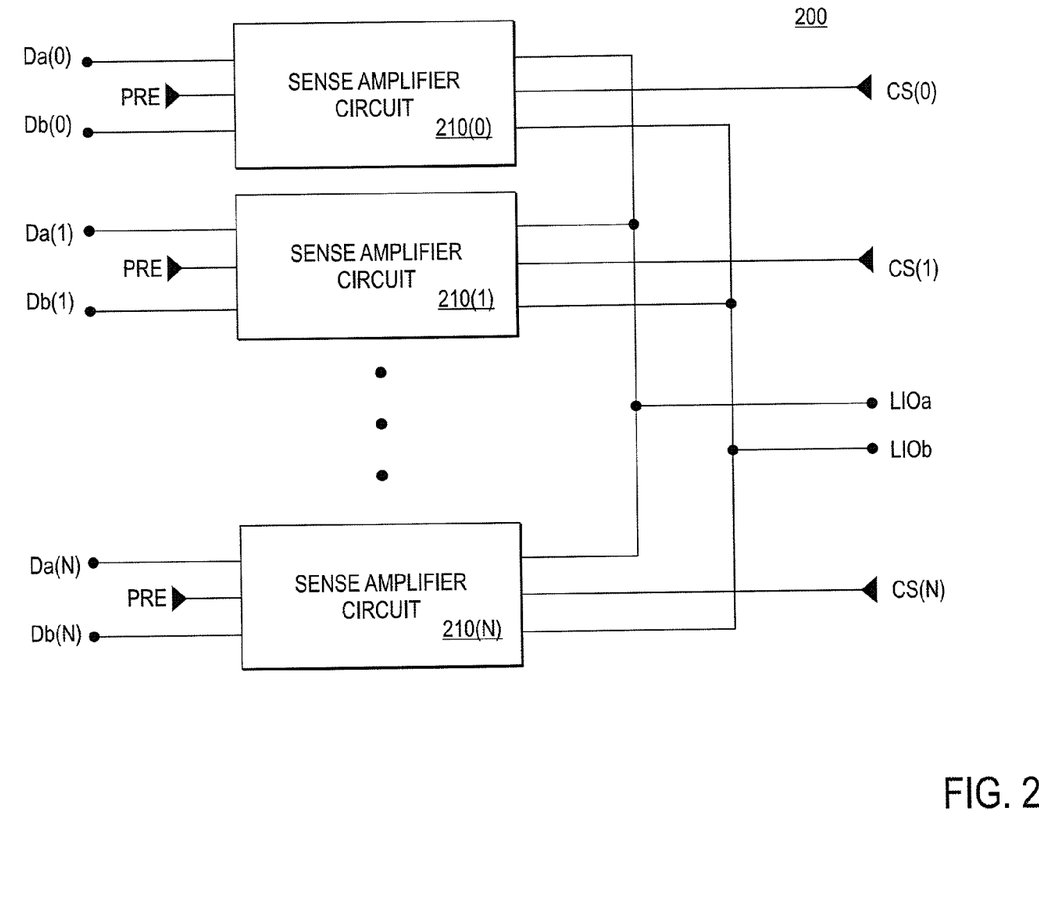
FIG. 2 is a block diagram of an apparatus including a plurality of sense amplifier circuits according to an embodiment of the invention.

FIG. 2 illustrates an apparatus 200 that includes a plurality of sense amplifier circuits 210(0)-210(N) according to an embodiment of the invention. The apparatus 200 may be included in the sense amplifier regions sa0-sa(M−1) of the apparatus 100. The sense amplifier circuits 210(0)-210(N) may be coupled to LIO lines LIOa and LIOb. The sense amplifier circuits 210(0)-210(N) may represent a group of sense amplifier circuits coupled to a set of LIO lines LIOa and LIOb. Several groups of sense amplifier circuits 210(0)-210(N) may be included in a sense amplifier region, for example, a sense amplifier region of the sense amplifier regions sa0-sa(M−1). A group may include one or more sense amplifier circuits, for example, in some embodiments, a group of sense amplifier circuits may include 16 sense amplifiers circuits. The number of sense amplifier circuits included in a group may determine a number of CSEL lines included in the sense amplifier region.

Each sense amplifier circuit 210 is coupled to a respective differential pair of digit lines Da and Db. The sense amplifier circuits 210 are configured to sense a difference (e.g., voltage, current) on the respective digit lines Da and Db and amplify the difference to provide a voltage difference. The voltage difference of a sense amplifier circuit 210 may be coupled to the LIOa, LIOb lines based on a respective column select signal CS. For example, the sense amplifier circuit 210(0) may provide a voltage difference to the LIOa and LIOb lines responsive to an active CS(0) signal. Likewise, the sense amplifier circuit 210(1) may provide a voltage difference to the LIOa and LIOb lines responsive to an active CS(1) signal. Each sense amplifier circuit 210 further receives a precharge signal PRE. An active PRE signal causes the sense amplifier circuits 210(0)-210(N) to precharge the respective digit lines Da and Db to a precharge voltage in preparation for a subsequent sense and amplification operation.

Figure 3:
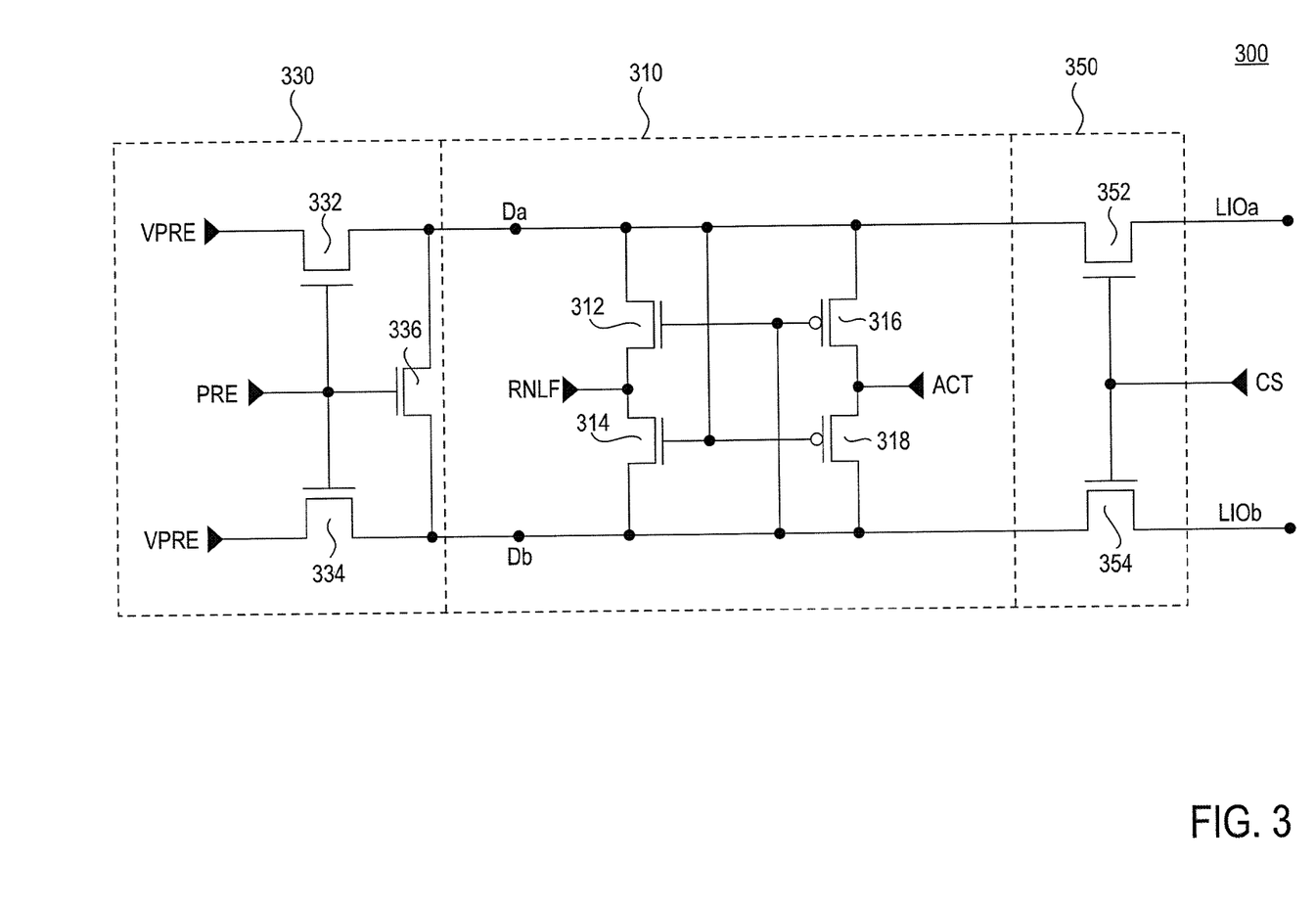
FIG. 3 is a schematic diagram of a sense amplifier circuit according to an embodiment of the invention.

FIG. 3 illustrates a sense amplifier circuit 300 according to an embodiment of the invention. The sense amplifier circuit 300 includes a sense amplifier 310, a precharge circuit 330, and a column select circuit 350. When activated, the sense amplifier 310 is configured to sense a difference (e.g., voltage, current) between nodes Da and Db, to which a differential pair of digit lines may be coupled. The sense amplifier 310 may be activated by active sense amplifier activation signals ACT and RNLF. The sense amplifier 310 includes pull-down circuits 312, 314 and pull-up circuits 316, 318. Gates of the pull-down and pull-up circuits 312 and 316 are coupled to node Db, and gates of the pull-down and pull-up circuits 314 and 318 are coupled to node Da.

The precharge circuit 330 is configured to precharge the nodes Da and Db to a precharge voltage VPRE responsive to an active PRE signal. The precharge circuit 330 includes precharge switches 332 and 334 having gates coupled to receive the PRE signal. The precharge circuit 330 may further include a equilibration switch 336 having a gate coupled to receive the PRE signal. When the switches 332, 334, and 336 are activated by an active PRE signal, the VPRE voltage is coupled to the nodes Da and Db through the precharge switches 332 and 334, and the Da and Db nodes are coupled together to equalize the voltage. The nodes Da and Db are typically precharged and equilibrated in preparation for a sense operation by the sense amplifier 310. The column select circuit 350 is configured to couple the sense amplifier 310 to the LIOa and LIOb lines through column select switches 352 and 354 responsive to an active column select signal CS. The CS signal may be provided by a column decoder that provides an active CS signal to couple a sense amplifier corresponding to a column address to the LIOa and LIOb lines.

The pull-down switches 312 and 314, the precharge switches 332 and 334, equilibration switch 336, and the column select switches 352 and 354 are illustrated in FIG. 3 as n-channel field effect transistors (NFETs), and the pull-up transistors 316 and 318 are illustrated in FIG. 3 as p-channel field effect transistors (PFETs). Other circuits may be used as well for these switches without departing from the scope of the present invention.

In operation, an active PRE signal is provided to the precharge circuit 330 to precharge nodes Da and Db to the VPRE voltage prior to the sense amplifier 310 being activated. The precharge switches 332 and 334, and the equilibration switch 336 are deactivated by the PRE signal becoming inactive, allowing the nodes Da and Db to float at the VPRE voltage. A memory cell is then coupled to a digit line that is coupled to node Da or Db. The memory cell may be coupled to the digit line, for example, responsive to a wordline being activated. In the present example operation, it is assumed that the digit line is coupled to the node Da and the memory cell stores a "1" bit of data, (e.g., stores some charge).

As a result of the memory cell being coupled to the digit line (which is coupled to node Da), the charge of the memory cell is shared with node Da. An active ACT signal (active high) and an active RNLF (active low) signal are provided to activate the sense amplifier 310. The pull-down transistor 314 begins to become conductive due to the charge on node Da, thus pulling node Db down to the low voltage of the RNLF signal. The pull-up transistor 316 begins to become conductive as the node Db is pulled down, thus pulling up node Da to the high voltage of the ACT signal. The positive feedback of pulling up node Da and pulling down node Db results in the node Da being pulled up to the voltage of the ACT signal and the node Db being pulled down to the voltage of the RNLF signal.

After the nodes Da and Db are sufficiently split (e.g., having a voltage difference), an active CS signal is provided to activate the column select switch 350 of the sense amplifier circuit 300 coupled to the memory cell being accessed. The activated column select switch 350 couples the nodes Da and Db to the LIOa and LIOb lines, respectively, to provide the voltage of the ACT signal to the LIOa line and the voltage of the RNLF signal to the LIOb line. As previously discussed, the LIOa and LIOb lines are then coupled to the global lines (e.g., the GRD or GWR lines).

The configuration of the sense amplifier circuit 300 may be laid out in a manner that facilitates the CSEL lines being located in the sense amplifier regions (e.g., sa0-sa(M−1) and extending in a same direction as wordlines of the memory sections Sec0-SecM. As previously discussed, the CSEL lines may be relatively shorter compared to architectures having CSEL lines extending over multiple memory sections. The shorter CSEL lines may provide benefits, such as, faster memory access cycle times and/or lower power consumption compared to an architecture having longer CSEL lines. The configuration of the sense amplifier circuit 300 may be laid out in a manner that facilitates relatively shorter LIOa and LIOb lines that are coupled to a fewer number of sense amplifiers for a group of sense amplifier circuits in a group, which may provide improved access times.

Figure 4:
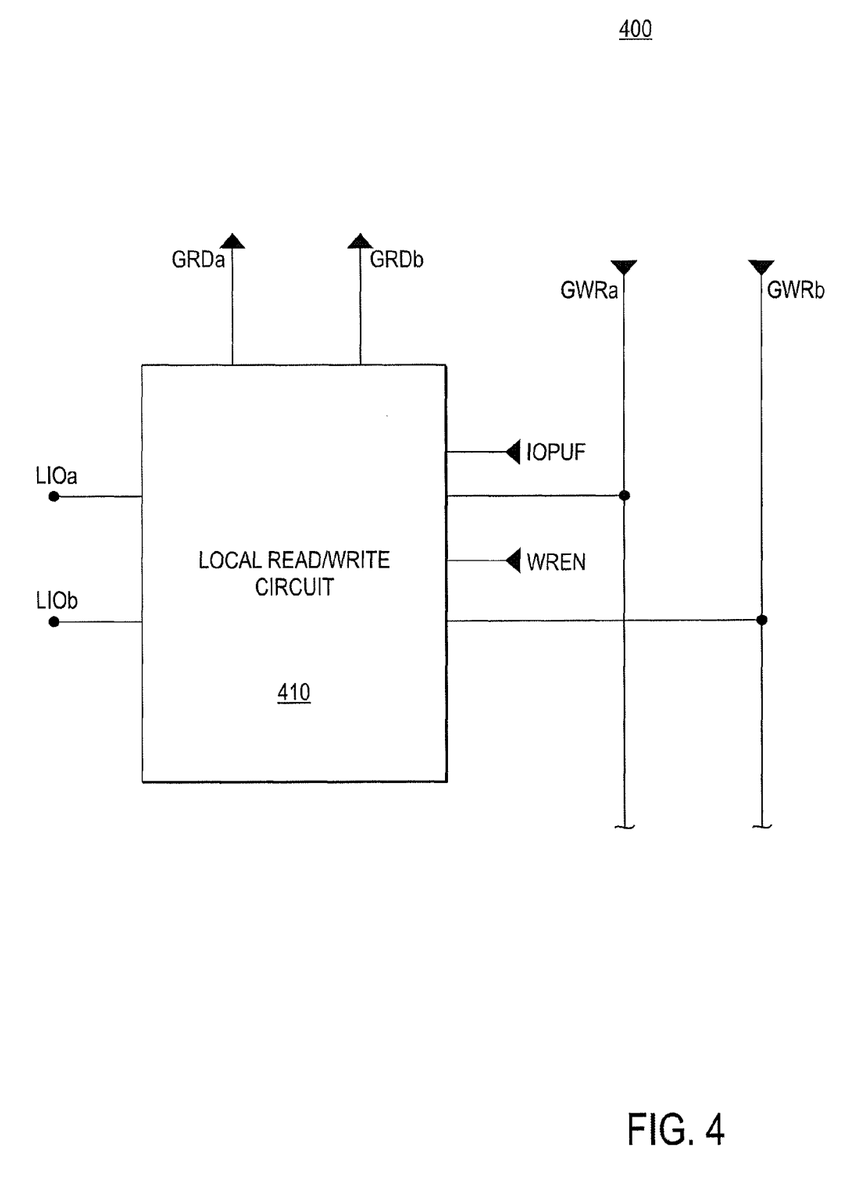
FIG. 4 is a block diagram of an apparatus including a local read/write circuit according to an embodiment of the invention.

FIG. 4 illustrates an apparatus 400 including a local read/write circuit 410 according to an embodiment of the invention. The local read/write circuit 410 is configured to provide a voltage difference on the LIOa and LIOb lines to the GRDa and GRDb lines. The local read/write circuit 410 is further configured to provide a voltage difference from the GWRa and GWRb lines to the LIOa and LIOb lines. The local read/write circuit 410 is further configured to precharge the LIOa and LIOb lines to a precharge voltage, for example, responsive to an active IOPUF signal. An example precharge voltage is a high logic level, such as a supply voltage VCC. Another example precharge voltage is a low logic level, such as ground. Another example precharge voltage is an intermediate voltage between the voltages for a high logic level and a low logic level.

The local read/write circuit 410 may be included in the sense amplifier regions of an array, for example, in the sense amplifier regions sa0-sa(M−1) of the array 110 illustrated in FIG. 1. A local read/write circuit 410 may be associated with a group of sense amplifier circuits, for example, one local read/write circuit 410 may be associated with a group of sense amplifier circuits 210(0)-210(N) of FIG. 2. Thus, where a sense amplifier region includes several groups of sense amplifier circuits, each group of sense amplifier circuits may have a respective local read/write circuit.

In a read operation, the local read/write circuit 410 precharges the LIOa and LIOb lines in preparation for a voltage difference being coupled to the LIOa and LIOb lines (e.g., from a sense amplifier through an activated column select circuit). As previously described, the LIOa and LIOb lines may be precharged to a high logic level. The GRDa and GRDb lines may be precharged to a high logic level as well, for example, by precharge circuits included in a read/write circuit. After precharging, a voltage difference is coupled to the LIOa and LIOb lines, for example, responsive to activation of a column select switch that couples an activated sense amplifier to the LIOa and LIOb lines. The local read/write circuit 410 provides a voltage difference on the GRDa and GRDb lines based on the voltage difference coupled to the LIOa and LIOb lines. A data amplifier coupled to the GRDa and GRDb lines (e.g., a data amplifier included in read/write circuit 120 of FIG. 1) amplifies the voltage difference, which represents a data state, and provides the data to be output from the memory.

In a write operation, the local read/write circuit 410 precharges the LIOa and LIOb lines in preparation for write data (e.g., a voltage difference) being coupled to the LIOa and LIOb lines. The local read/write circuit 410 couples the GWRa and GWRb lines to the LIOa and LIOb lines to provide a voltage difference representing write data. That is, a write data driver (e.g., a write data driver included in read/write circuit 120 of FIG. 1) provides a voltage difference on the GWRa and GWRb lines representing write data to be provided to the LIOa and LIOb lines. The GWRa and GWRb lines are coupled to the LIOa and LIOb lines to provide the voltage difference from the GWRa and GWRb lines to the LIOa and LIOb lines, for example, responsive to an active write enable signal WREN. The voltage difference provided to the LIOa and LIOb lines sets a voltage difference on a sense amplifier coupled to the LIOa and LIOb lines to write data to a memory cell coupled to the sense amplifier (e.g., through a digit line).

Using separate global read lines and global write lines (e.g., GRDa and GRDb, GWRa and GWRb) may prevent excessive current flow during write operations, for example, in sense amplifier regions associated with inactive memory sections (e.g., memory sections that do not include memory being accessed during a memory operation) during the write operation. The voltage conditions for the sense amplifier regions associated with inactive memory sections having a conventional global input/output line that is used for both reading and writing data, may result in causing a short circuit between a power supply and ground. For example, a short circuit between a global input/output line and either the power supply or ground may be created. As a result, a current path between high to low or low to high voltages may be created and result in excessive current flow. The separate global read lines and global write lines, however, prevent a short circuit from being created in the sense amplifier regions associated with the inactive memory sections during a write operation.

Figure 5A:
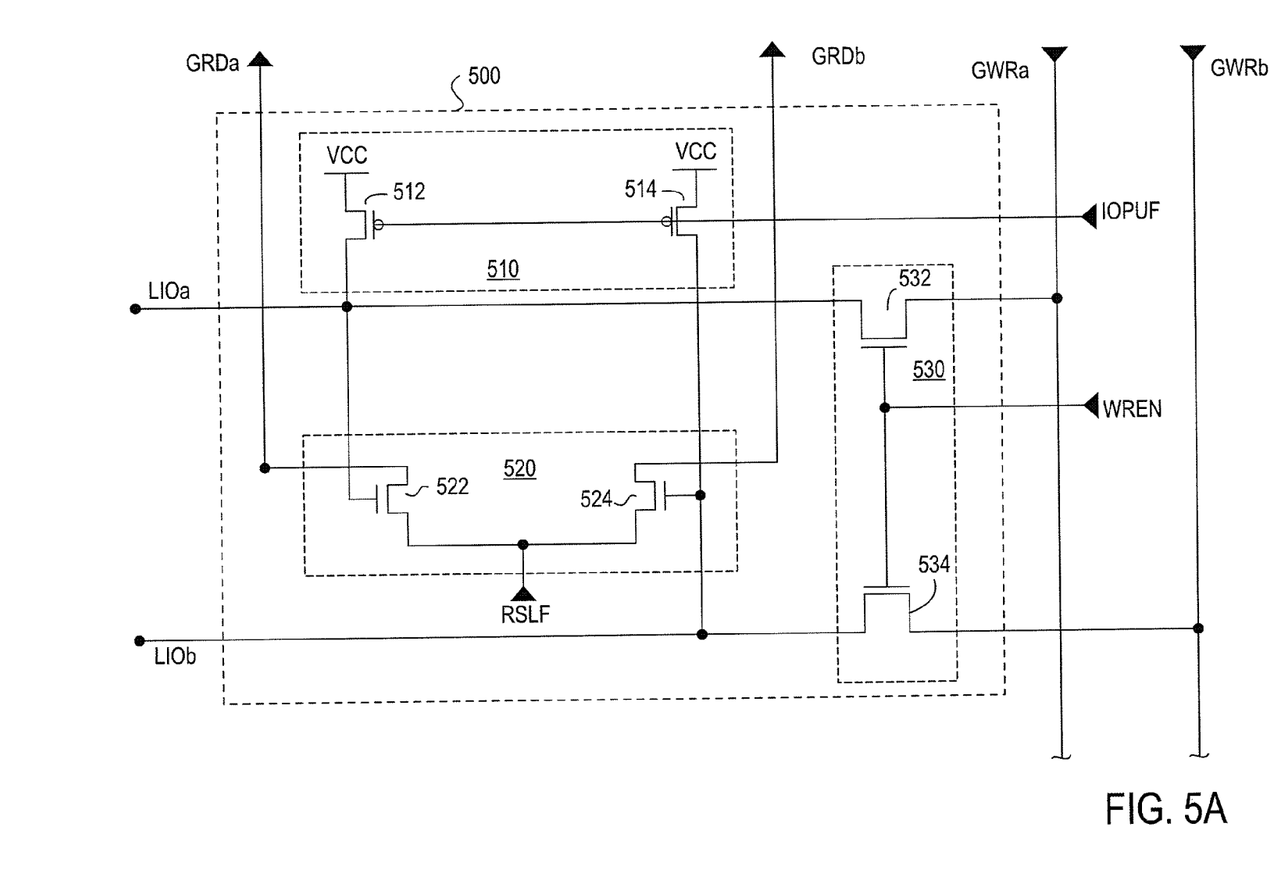
FIG. 5A is a schematic diagram of a local read/write circuit according to an embodiment of the invention.

FIG. 5A illustrates a local read/write circuit 500 according to an embodiment of the invention. The local read/write circuit 500 may be included in the local read/write circuit 410 of FIG. 4. The local read/write circuit 500 includes a precharge circuit 510 coupled to the LIOa and LIOb lines. The precharge circuit 510 is configured to precharge the LIOa and LIOb lines to a precharge voltage (e.g., supply voltage VCC) responsive to an active (e.g., active low) precharge signal IOPUF. The precharge circuit 510 includes precharge switches 512 and 514 that couple the precharge voltage to the lines responsive to the IOPUF signal. A read circuit 520 coupled to the LIOa and LIOb lines and the GRDa and GRDb lines is configured to couple one of the GRDa and GRDb lines to a read voltage RSLF based on which of the LIOa and LIOb lines has a high logic level. The read circuit 520 includes read switches 522 and 524 having gates coupled to a respective LIOa and LIOb line, and a drain coupled to a respective GRDa and GRDb line. The GWRa and GWRb lines may be coupled to the LIOa and LIOb lines through a write circuit 530. The write circuit 530 includes write switches 532 and 534 that are activated responsive to an active write enable signal WREN. The RSLF voltage may be provided to the local read/write circuit 500 over a RSLF voltage bus to which other local read/write circuits may be coupled to receive the same RSLF voltage. For example, the local read/write circuits included in a sense amplifier region may each be provided the same RSLF voltage. Other groupings of local read/write circuits may receive the same RSLF voltage as well. Different groupings of local read/write circuits may receive different RSLF voltages. For example, the local read/write circuits in a sense amplifier region associated with an inactive memory section may be provided with a high voltage level RSLF voltage, whereas the local read/write circuits in a sense amplifier region associated with an active memory section may be provided with a high voltage level RSLF voltage that may change voltage levels (from a high voltage level to a low voltage level, and/or from a low voltage level to a high voltage level) during a memory access operation.

In the embodiment illustrated in FIG. 5A, the precharge switches 512 and 514 are PFETs, and the read switches 522 and 524 and the write switches 532 and 534 are NFETs. Other circuits may be used as well for these switches without departing from the scope of the present invention.

In operation, the precharge circuit 510 is activated responsive to an active IOPUF signal, thereby coupling the LIOa and LIOb lines through precharge switches 512 and 514 to the precharge voltage (shown in FIG. 5A as a supply voltage VCC). The read switches 522 and 524 of the read circuit 520 are activated due to the gates being coupled to the precharge voltage. During precharge, the RSLF voltage is at a high logic level (e.g., at the VCC voltage). Following precharge of the LIOa and LIOb lines, the LIOa and LIOb lines are at the precharge voltage in preparation for a read or write operation.

In a read operation, the precharge circuit 510 is deactivated responsive to an inactive IOPUF signal and a voltage difference is provided to the precharged LIOa and LIOb lines, for example, responsive to activation of a column select circuit that couples an activated sense amplifier to the LIOa and LIOb lines. In the present example, it is assumed that a high logic level is coupled to the LIOa line and a low logic level is coupled to the LIOb line. The read switch 524 is deactivated (and read switch 522 remains activated) and the RSLF voltage changes to a low logic level. As a result, the GRDa line is coupled to the low voltage of the RSLF voltage. As a result, a voltage difference is provided on the GRDa and GRDb lines, in particular, the GRDa line is at a low voltage level and the GRDb line is at a high voltage level. A data amplifier coupled to the GRDa and GRDb lines amplifies the voltage difference, which represents a data state, and provides data to be output from the memory.

In a write operation, the write circuit 530 is activated by an active WREN signal to couple a voltage difference on the GWRa and GWRb lines representing write data to the LIOa and LIOb lines. As previously described, a write data driver provides a voltage difference on the GWRa and GWRb lines representing write data. The voltage difference is provided to the LIOa and LIOb lines to be written to a memory cell through the sense amplifier coupled to the LIOa and LIOb lines. During the write operation, one of the switches 522 and 524 of the read circuit 520 may be activated, however, the RSLF voltage is at the precharge voltage (e.g., a high logic level voltage) to prevent current flow through the activated switch.

Following the read or write operation, the LIOa and LIOb lines (e.g., by the precharge circuit 510) may be precharged to the precharge voltage in preparation for another read or write operation.

Figure 5B:
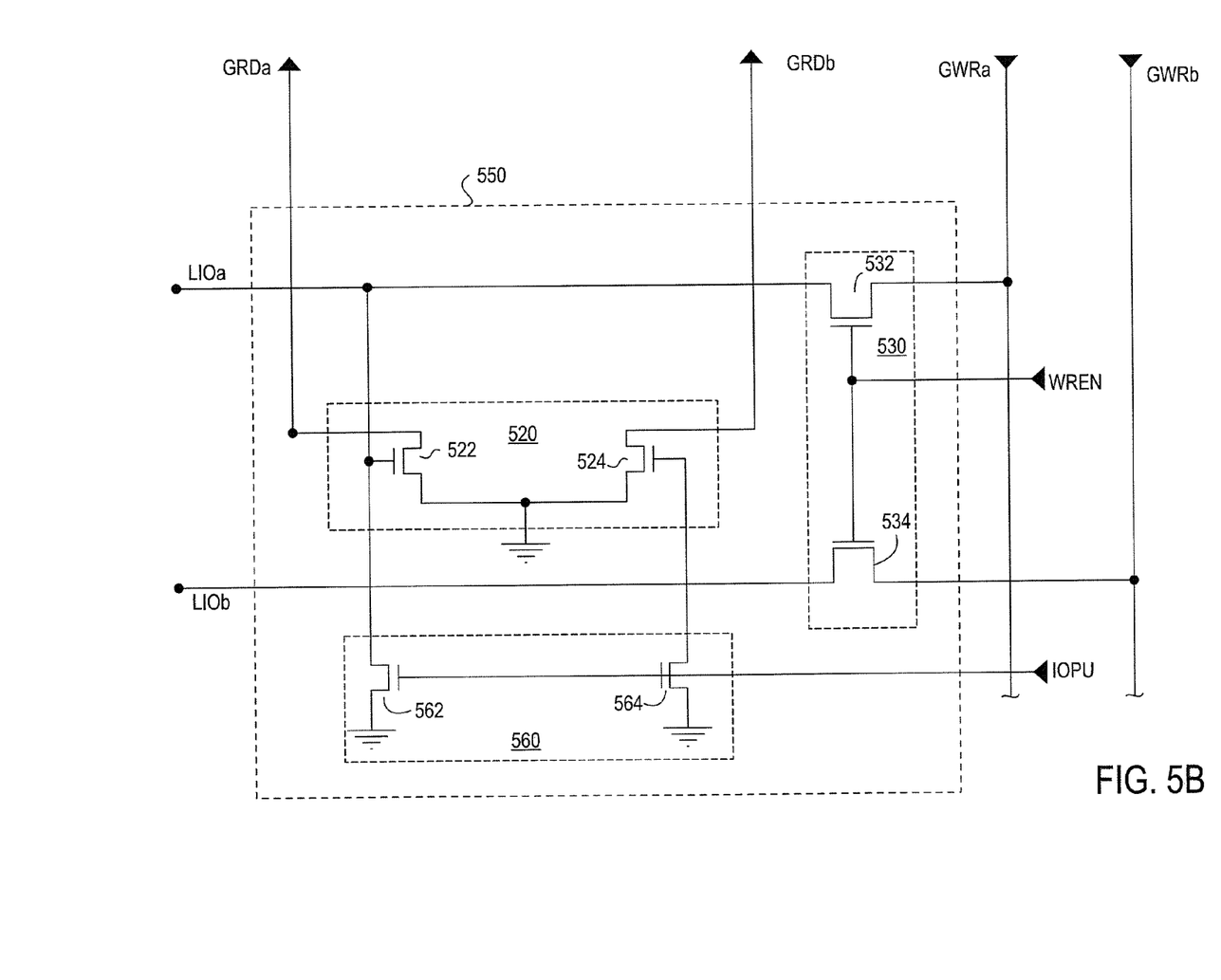
FIG. 5B is a schematic diagram of a local read/write circuit according to an embodiment of the invention.

FIG. 5B illustrates a local read/write circuit 550 according to an embodiment of the invention. The local read/write circuit 550 may be included in the local read/write circuit 410 of FIG. 4. The local read/write circuit 550 includes circuitry previously discussed with reference to the local read/write circuit 500 of FIG. 5A. The common circuitry will be referenced in FIG. 5B using the same reference numbers as used in FIG. 5A, and the common circuitry will not be described again in detail for the sake of brevity.

The local read/write circuit 550 includes a precharge circuit 560 coupled to the LIOa and LIOb lines. The precharge circuit 560 is configured to precharge the LIOa and LIOb lines to a precharge voltage (e.g., ground) responsive to an active (e.g., active high low) precharge signal IOPU. The precharge circuit 560 includes precharge switches 562 and 564 that couple the precharge voltage to the lines responsive to the IOPU signal. In the embodiment illustrated in FIG. 5B, the precharge switches 562 and 564 are NFETs. Other circuits may be used as well for these switches without departing from the scope of the present invention. A read circuit 520 coupled to the LIOa and LIOb lines and the GRDa and GRDb lines is configured to couple one of the GRDa and GRDb lines to ground based on which of the LIOa and LIOb lines has a high logic level. The read circuit 520 includes read switches 522 and 524 having gates coupled to a respective LIOa and LIOb line, and a drain coupled to a respective GRDa and GRDb line.

In operation, the precharge circuit 560 is activated responsive to an active IOPU signal, thereby coupling the LIOa and LIOb lines through precharge switches 562 and 564 to the precharge voltage (shown in FIG. 5B as ground). Following precharge of the LIOa and LIOb lines, the LIOa and LIOb lines are at the precharge voltage in preparation for a read or write operation. The GRDa and GRDb lines may be precharged, for example, to a high voltage level (e.g., VCC), by precharge circuits included in the read/write circuit. In some embodiments, the GRDa and GRDb lines may be precharged to a precharge voltage that is less than the high voltage level, for example, an intermediate voltage between the low voltage level and the high voltage level.

In a read operation, the precharge circuit 550 is deactivated responsive to an inactive IOPU signal and a voltage difference is provided to the precharged LIOa and LIOb lines, for example, responsive to activation of a column select circuit that couples an activated sense amplifier to the LIOa and LIOb lines. In the present example, it is assumed that a high logic level is coupled to the LIOa line and a low logic level is coupled to the LIOb line. The read switch 522 is activated (and read switch 524 remains deactivated). As a result, the GRDa line is coupled to ground through the activated read switch 522. As a result, a voltage difference is provided on the GRDa and GRDb lines, in particular, the GRDa line is at a low voltage level and the GRDb line is at a high voltage level. A data amplifier coupled to the GRDa and GRDb lines amplifies the voltage difference, which represents a data state, and provides data to be output from the memory.

In a write operation, a voltage difference is provided to the precharged LIOa and LIOb lines, for example, responsive to activation of a column select circuit that couples an activated sense amplifier to the LIOa and LIOb lines. Additionally, the write circuit 530 is activated by an active WREN signal to couple a voltage difference on the GWRa and GWRb lines representing write data to the LIOa and LIOb lines. The voltages of the precharge GRDa and GRDb lines are changed to a low voltage level for the write operation. In some embodiments where the GRDa and GRDb lines are precharged to an intermediate voltage level, the power consumption in comparison to precharging the GRDa and GRDb lines to a high voltage level may be reduced. As previously described, a write data driver provides a voltage difference on the GWRa and GWRb lines representing write data. The voltage difference is provided to the LIOa and LIOb lines to be written to a memory cell through the sense amplifier coupled to the LIOa and LIOb lines. During the write operation, one of the switches 522 and 524 of the read circuit 520 may be activated, however, changing the voltages of the GRDa and GRDb lines to a low voltage level for the write operation prevents current flow through the activated switch.

Figure 6:
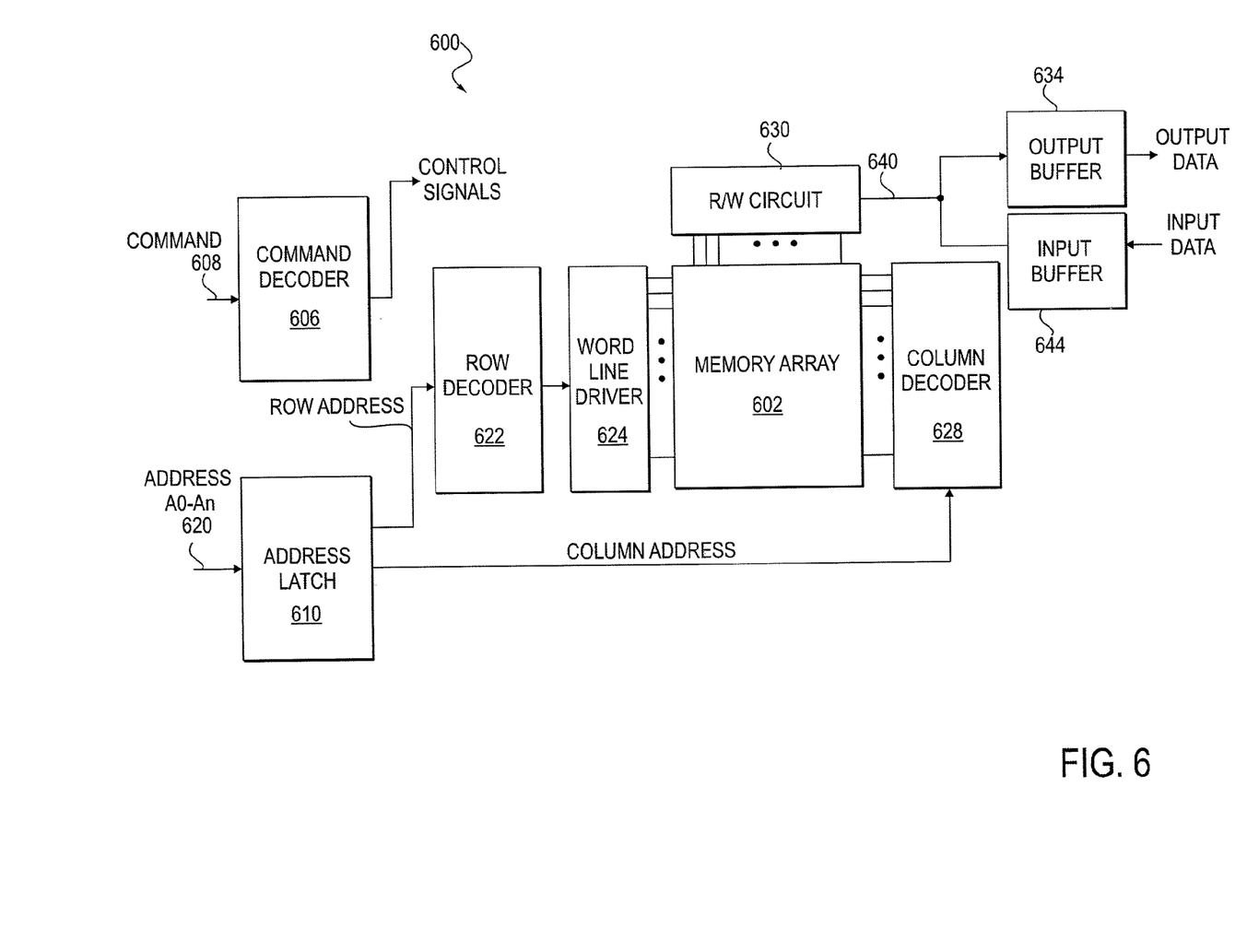
FIG. 6 is a block diagram of a memory including an embodiment of the invention.

FIG. 6 illustrates a portion of a memory 600 including an embodiment of the present invention. The memory 600 includes an array 602 of memory cells, which may be, for example, volatile memory cells and/or non-volatile memory cells. The array 602 may include an array of memory cells according to an embodiment of the invention, for example, array 110 of FIG. 1. The memory 600 includes a command decoder 606 that receives memory commands through a command bus 608 and generates corresponding control signals within the memory 600 to carry out various memory operations. The command decoder 606 responds to memory commands applied to the command bus 608 to perform various operations on the array 602. In particular, the command decoder 606 is used to generate internal control signals to read data from and write data to the array 602.

Row and column address signals are applied to the memory 600 through an address bus 620 and provided to an address latch 610. The address latch then outputs a separate column address and a separate row address. The row and column addresses are provided by the address latch 610 to a row address decoder 622 and a column address decoder 628, respectively. The row address decoder 622 is connected to word line driver 624 that activates respective rows of memory cells in the array 602 corresponding to received row addresses. The column address decoder 628 selects bit lines extending through the array 602 corresponding to respective column addresses. The selected data line (e.g., a bit line or bit lines) corresponding to a received column address is coupled to a read/write circuitry 630 to provide read data to a data output buffer 634 via an input-output data bus 640.

The selected data line may be coupled to the read/write circuitry 630 through a sense amplifier, column select circuit, local input/output line, local read/write circuit, and global read lines according to an embodiment of the invention, for example, as previously discussed with reference to FIGS. 2-5. Write data are applied to the array 602 through a data input buffer 644 and the array read/write circuitry 630. The write data may be applied to the array from the read/write circuitry 630 through global write lines, local read/write circuit, local input/output line, column select circuit, and sense amplifier, according to an embodiment of the invention, for example, as previously discussed with reference to FIGS. 2-5.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   first and second memory sections, each memory section including a wordline extending in a first direction and a digit line extending in a second direction perpendicular to the first direction;
   a global read line and a separate global write line extending over the first and second memory sections in the second direction;
   a read/write circuit comprising:
      a data amplifier coupled to the global read line and configured to amplify read data from the memory sections via the global read line; and
      a write data driver configured to drive write data and to provide the write data to the memory sections via the global write line;
   a sense amplifier region disposed between the first and second memory sections, the sense amplifier region including:
      a sense amplifier coupled to the digit line;
      a local input/output line;
      a column select circuit coupled to the sense amplifier and configured to couple the sense amplifier to the local input/output line responsive to an active column select signal; and
      a column select line coupled to the column select circuit and configured to provide a column select signal to the column select circuit, wherein the column select line extends in the first direction which is perpendicular to a global read line and a separate global write line,
   wherein the global write line is configured to provide the write data which is amplified by the write data driver.

2. The apparatus of claim 1, further comprising:
   a local read/write circuit, coupled to a global read line and a separate global write line, the local read/write circuit configured to provide data from the local input/output line to the global read line and further configured to provide data from the global write line to the local input/output line.

3. The apparatus of claim 2 wherein the sense amplifier region further includes a plurality of groups of sense amplifier circuits, each group coupled to a respective local read/write circuit.

4. The apparatus of claim 3 wherein the respective local read/write circuit comprises:
   a read circuit coupled to the local input/output line and configured to couple a signal line of the global read line to a read voltage based at least in part on a first voltage difference on the local input/output line; and
   a write circuit coupled to the local input/output line and configured to couple global write line to the local input/output line responsive to being activated to provide a second voltage difference to the local input/output line.

5. The apparatus of claim 4 wherein the same read voltage is provided to the local read/write circuits included in the sense amplifier region.

6. The apparatus of claim 1 wherein the read/write circuit further comprises:
   precharge circuits configured to precharge the global read line to a precharge voltage.

7. The apparatus of claim 6 wherein the precharge voltage is a high voltage level.

8. The apparatus of claim 6 wherein the precharge voltage is an intermediate voltage level.

9. The apparatus of claim 6, wherein each precharge circuit comprises:
   a pair of precharge switches coupled to the digit line and a precharge voltage; and
   an equilibration switch coupled to the digit line.

10. The apparatus of claim 1 wherein the global read line is a first differential pair of signal lines and the global write line is a second differential pair of signal lines.

11. The apparatus of claim 1 wherein the digit line is a first differential pair of signal lines and the local input/output line is a second differential pair of signal lines.

12. The apparatus of claim 1 wherein the sense amplifier is one of a plurality of sense amplifiers included in the sense amplifier region, wherein the column select circuit is one of a plurality of column select circuits, and wherein the column select line is one of a plurality of column select lines, each of the plurality of column select circuits coupled to a respective one of the plurality of sense amplifiers and further coupled to a respective one of the plurality of column select lines, each of the plurality of column select circuits configured to couple the respective one of the plurality of sense amplifiers to the local input/output line responsive to an active column select signal provided on the respective one of the plurality of column select lines.

13. The apparatus of claim 1 wherein the plurality of column select lines extend in the first direction and are included in the sense amplifier region.

14. The apparatus of claim 1 wherein the sense amplifier region further includes a precharge circuit coupled to the sense amplifier and the digit line, the precharge circuit configured to precharge and equilibrate the digit line responsive to an active precharge signal.

\* \* \* \* \*